(12) United States Patent
Nishioki et al.

(10) Patent No.: US 6,490,300 B1
(45) Date of Patent: Dec. 3, 2002

(54) WAVELENGTH-STABILIZED LIGHT SOURCE APPARATUS

(75) Inventors: Nobuhisa Nishioki; Kiyokazu Okamoto, both of Ibaraki (JP)

(73) Assignee: Mitutoyo Corporation, Kawasaki (JP)

( * ) Notice: Subject to any disclaimer, the term of this patent is extended or adjusted under 35 U.S.C. 154(b) by 86 days.

(21) Appl. No.: 09/610,221

(22) Filed: Jul. 3, 2000

(30) Foreign Application Priority Data

Jul. 14, 1999 (JP) .......................................... 11-200688

(51) Int. Cl.$^7$ ................................................. H01S 3/13
(52) U.S. Cl. ........................................................ 372/32
(58) Field of Search .......................... 372/9, 20, 29.01, 372/29.011, 32, 38.02; 356/451

(56) References Cited

U.S. PATENT DOCUMENTS

| | | | | |
|---|---|---|---|---|
| 4,856,009 A | * | 8/1989 | Hall et al. ..................... | 372/32 |
| 5,388,115 A | * | 2/1995 | Kawashima et al. .......... | 372/24 |
| 5,453,833 A | * | 9/1995 | Kawashima et al. ......... | 356/345 |
| 5,485,274 A | * | 1/1996 | Kemmler ..................... | 356/350 |
| 5,493,395 A | * | 2/1996 | Otsuka ........................ | 356/349 |
| 6,034,976 A | * | 3/2000 | Mossberg et al. ............. | 372/32 |

OTHER PUBLICATIONS

Peter de Groot and Stanley Kishner, "Synthetic wavelength stabilization for two–color laser–diode interferometry", Oct. 1, 1991, Applied Optics, pp. 402226–4033.

* cited by examiner

*Primary Examiner*—Paul Ip
*Assistant Examiner*—Jeffrey Zahn
(74) *Attorney, Agent, or Firm*—Oliff & Berridge, PLC (57) ABSTRACT

A part of the output light from a semiconductor laser (1), which has a wavelength controllably variable with an injection current, is split at a beam splitter (3) and introduced into a interference optical system (5). In order to vary an optical path length difference between two light beams in the interference optical system (5) to modulate interference fringes to be obtained, AOMs (55, 56) are arranged on the two split optical paths and an EOM (56) on one of them. The interference fringes obtained from the interference optical system (5) are received at a photoreceptive device (7), and from the received signal, the phase is detected by a phase detector (8) and the phase amplitude is detected by an amplitude extractor (9). In order to stabilize the wavelength, a controller (10) feedback controls the injection current to the semiconductor laser (1) so that the phase amplitude matches to a predetermined setting.

11 Claims, 5 Drawing Sheets

WAVELENGTH-STABILIZED LIGHT SOURCE APPARATUS

BACKGROUND OF THE INVENTION

1. Field of the Invention

The present invention relates to a coherent light source apparatus such as a variable wavelength semiconductor laser for use in a lightwave interferometer that obtains various mechanical measures. More particularly, the present invention relates to a light source apparatus having a wavelength-stabilized output light.

2. Description of the Related Art

A semiconductor laser is a coherent light source, which varies its oscillation wavelength in accordance with a temperature and an injection current. This wavelength variability of the semiconductor laser shows many possibilities in the field of the lightwave interferometry. For example, when plural light sources with slightly different wavelengths are required, a plurality of lasers must be employed if they are stabilized lasers of fixed oscillation wavelength type, while only a single semiconductor laser of variable wavelength type can respond to this case by switching its output wavelength.

Known wavelength stabilization technologies for the semiconductor laser include a temperature control method, an injection current control method, an elementary-ray absorption method and a method that employs an external resonator together. The temperature control method, however, needs much time for switching of temperatures and can not perform fast switching of output wavelengths. The temperature control and injection current control methods can not ensure the oscillation wavelength to be set accurately to a desired value even if a temperature or injection current is controlled to a predetermined setting. The elementary-ray absorption method, even though it can achieve wavelength stabilization, is not adaptive to a variable wavelength light source in a measurement system that requires an arbitrary switching of wavelengths. In the method that employs the external resonator, its light source structure becomes complicated.

SUMMARY OF THE INVENTION

The present invention has been made in consideration of the above and accordingly has an object to provide a wavelength-stabilized light source apparatus capable of performing fast wavelength stabilizing control with a designation of an arbitrary wavelength.

First, the present invention is provided with a wavelength-stabilized light source apparatus, which comprises a coherent light source of which wavelength is variably controlled by a driver; a beam splitter for splitting the output light from the coherent light source to obtain a part thereof as a control light; a interference optical system for further splitting the control light is two, then giving a predetermined optical path length difference to the resultant two control lights and synthesizing them to generate interference fringes; a modulator for giving a variation to the optical path length difference in the interference optical system to modulate the interference fringes to be obtained; a photoreceptive device for receiving the interference fringes obtained from the interference optical system; a demodulator for detecting a degree of modulation of a received signal obtained from the photoreceptive device; and a controller for feedback controlling a driving condition for the driver so that the output from the demodulator matches to a predetermined setting.

According to the first wavelength-stabilized light source apparatus, a part of the output light from the coherent light source is extracted as the control light, which enters the interference optical system to modulate the optical path length difference, resulting in the interference fringes. Using the dependency of the degree of modulation of the received signal on the wavelength, the wavelength stabilization is performed by feedback controlling the driver so that the demodulated output matches to the setting. Thus, by designation of an arbitrary wavelength from the external, the output wavelength of the coherent light source can be stabilized at a high speed with a high precision.

In the first wavelength-stabilized light source apparatus, the modulators are arranged, for example, respectively on the optical paths for the two control lights in the interference optical system. The modulators includes two acoustic optical modulators (AOM) driven with different angular frequencies to generate an interfered beat with a difference between the angular frequencies, $\omega c$; and an electrical optical modulator (EOM) arranged on the optical path for one of the two control lights in the interference optical system to phase-modulate the output light in the from of a sinusoidal wave with an angular frequency of $\omega$. The demodulator includes a phase detector for FM-demodulating the received signal using a carrier signal with an angular frequency of $\omega c$ to obtain the phase term of the received signal. The controller feedback controls a driving condition for the coherent light source so that the amplitude of the phase term extracted by the phase extractor matches to a predetermined setting.

Second, the present invention is provided with a wavelength-stabilized light source apparatus, which comprises a reference light source for emitting a coherent reference light with a constant wavelength; a coherent light source of which wavelength is variably controlled by a driver; a beam splitter for splitting the output light from the coherent light source to obtain a part thereof as a control light; a interference optical system for receiving the control light split by the beam splitter and the reference light from the reference light source via different optical paths, splitting the control and reference lights respectively in two, then giving a predetermined optical path length difference respectively to the resultant two control and reference lights and synthesizing them to generate two interference fringes; a modulator for giving the same variation respectively to the optical path length differences of the reference and control lights in the interference optical system to modulate the two interference fringes obtained with respect to the reference and control lights; a pair of photoreceptive devices for receiving the two interference fringes with respect to the reference and control lights output from the interference optical system; a pair of demodulators for detecting degrees of modulations of received signals obtained with respect to the reference and control lights from the pair of photoreceptive devices; and a controller for feedback controlling a driving condition for the driver so that a ratio between the outputs from the pair of demodulators matches to a predetermined setting.

In the second wavelength-stabilized light source apparatus, in combinations with the reference light source, the control light or a part of the output light from the coherent light source and the reference light are introduced into the interference optical system to modulate respective optical path length differences, resulting in the two interference fringes. Using the dependency of the degrees of modulations of the received signals with respect to the reference and control lights on their wavelengths, the wavelength stabilization is performed by feedback controlling the driver so that the ratio between the demodulated outputs matches to a predetermined setting. Thus, by the designation from the external, on the basis of the relation between the wavelength of the reference light and the output wavelength of the coherent light source, the latter can be stabilized at a high speed with a high precision.

In the second wavelength-stabilized light source apparatus, there are several modes to modulate the received signals by giving a variation to the optical path length differences for the control and reference lights as follows:

(a) In a first mode, the variation given to the optical path length differences for the control and reference lights is an additional or reductive displacement at a constant velocity to amplitude-modulate the two interference fringes obtained with respect to the reference and control lights in according with wavelengths thereof, respectively.

In this case, the demodulators detect frequencies, f1 and f2, of intensity variations of the amplitude-modulated received signals obtained with respect to the reference and control lights. The controller feedback control the driver for the light source so that a ratio between the frequencies f1 and f2 matches to a predetermined setting.

(b) In a second mode, the variation given to the optical path length differences for the control and reference lights is a vibration in the form of a sinusoidal wave with a predetermined amplitude of d and an angular frequency to phase-modulate the received lights obtained with respect to the reference and control lights in accordance with wavelengths thereof, respectively.

In this case, the demodulators PM-demodulate the phase-modulated received signals with respect to the reference and control lights to detect the phase terms, $\psi 1=(2\pi d/\lambda 1)+\phi 1$ and $\psi 2=(2\pi d/\lambda 2)+\phi 2$ (where $\lambda 1$, $\lambda 2$ denote wavelengths of the reference and control lights, and $\phi 1$, $\phi 2$ initial phase magnitudes), and extract the amplitudes of the phase terms. The controller feedback controls the driver for the light source so that a ratio, $\lambda 2/\lambda 1$, between the phase terms matches to a predetermined setting.

(c) In a third mode, imparting a vibration in the form of a sinusoidal wave with a predetermined amplitude of d and an angular frequency of $\omega$ both on the optical path length differences of the reference and control lights; and simultaneously from acoustic optical modulators interposed in the optical paths, superimposing an interfered beat signal with an angular frequency of $\omega c$ both on the received signals of the reference and control lights to frequency-modulate the received signals obtained with respect to the reference and control lights in accordance with wavelengths thereof.

In this case, the demodulators FM-demodulate the frequency-modulated received signals obtained with respect to the reference and control lights using a carrier angular frequency of $\omega c$ to detect the phase terms, $\psi 1=(2\pi d/\lambda 1)+\phi 1$ and $104\ 2=(2\pi d/\lambda 2)+\phi 2$ (where $\lambda 1$, $\lambda 2$ denote wavelengths of the reference and control lights, and $\phi 1$, $\phi 2$ initial phase magnitudes), and extract amplitudes of these phase terms. The controller feedback controls the driver for the light source so that a ratio $\lambda 2/\lambda 1$, between the phase terms matches to a predetermined setting.

The method of imparting the sinusoidal wave vibration both on the optical path length differences of the reference and control lights may include a method of mechanically imparting a signal on a mirror and the like in the interference optical system using a piezoelectric device and the like. It may also include a method of electrical modulation using an electric optical modulator.

Other features and advantages of the invention will be apparent from the following description of the preferred embodiments thereof.

BRIEF DESCRIPTION OF THE DRAWINGS

The present invention will be more fully understood from the following detailed description with reference to the accompanying drawings in which.

DETAILED DESCRIPTION OF THE PREFERRED EMBODIMENTS

First Embodiment

Figure 1:
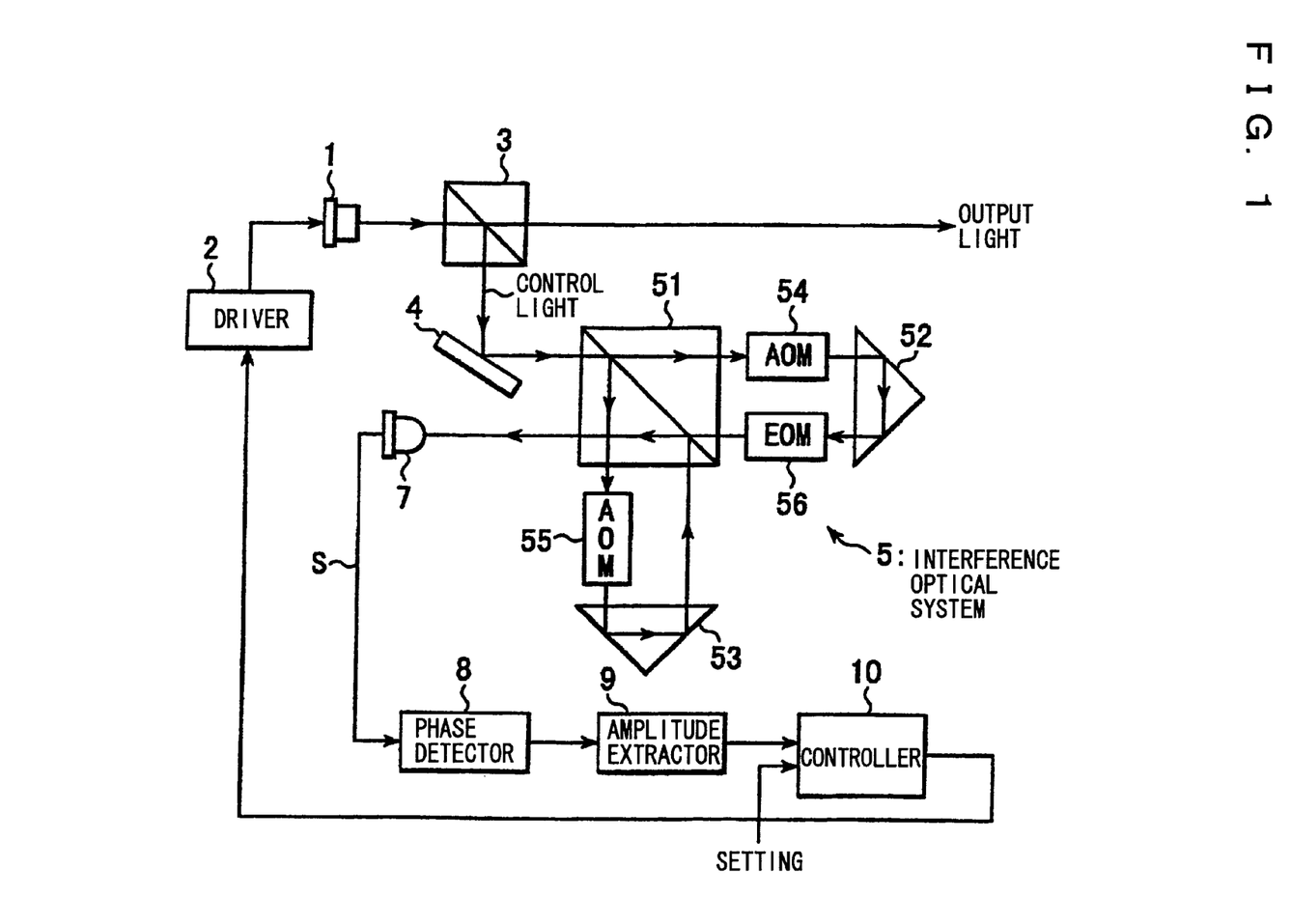
FIG. 1 is a diagram showing an arrangement of a wavelength-stabilized light source apparatus according to a first embodiment of the present invention.

FIG. 1 shows an arrangement of a wavelength-stabilized light source apparatus according to a first embodiment of the present invention. A semiconductor laser 1 is a coherent light source, which is subjected to wavelength stabilization. A driver 2 can variably control an injection current supplied to the semiconductor laser 1. The output light emitted from the semiconductor laser 1 is split partially by a beam splitter 3 to obtain a control light, which is then reflected at a mirror 4 and enters a interference optical system 5.

The interference optical system 5 is an interferometer, which comprises a beam splitter 51 for splitting the input light beam in two, and mirrors 52 and 53 for giving a difference in length between optical paths for the resultant two split light beams and returning them to the beam splitter 51. The two light beams returned to the same point in the beam splitter 51 are synthesized to generate interference fringes that correspond to the optical path length difference between the two light beams. The difference is determined from the locations of the mirrors 52 and 53.

In this embodiment, acoustic optical modulators (AOMs) 54 and 55 are interposed at some midpoints in the optical paths. They are employed for modulators that modulate the optical path length difference in the interferometric optical system 5. As shown in FIG. 1, the first AOM 54 is located on the forward path between the beam splitter 51 and the mirror 52, and the second AOM 55 on the forward path between the beam splitter 51 and the mirror 53. When the AOMs 54 and 55 are driven, an interfered beat signal can be generated in an order of 0.1–10 MHz from the two split control lights regardless to their wavelengths. The first AOM 54 is driven with an angular frequency of $\omega c1$ and the second AOM 55 with an angular frequency of $\omega c2$. As a result, an interfered beat signal with $\omega c=\omega c1-\omega c2$, which corresponds to the difference between the angular frequencies $\omega c1$ and $\omega c2$, is superimposed on the interference fringes that can be detected by a photoreceptive device 7.

An electric optical modulator (EOM) 56 is also interposed in the return path between the beam splitter 51 and the mirror 52 to electrically modulate the optical path length difference in the interference optical system 5. A driving signal in the form of sinusoidal wave is supplied to the EOM 56. The EOM 56 exhibits a refractive index variation in response to an electric field application. Thus, driving the EOM 56 with a sinusoidal wave signal is equivalent to give a sinusoidal wave variation to the optical path length difference in the interference optical system 5 and can phase modulate the received signal.

A sinusoidal wave displacement may also be given to the optical path length difference by imparting micro-vibrations mechanically on the mirror 52 from a piezoelectric device and the like, for example, instead of the electrical modulation by the EOM 56. The mechanical modulation, however, has a limitation in its rate. The use of the EOM 56 makes it possible to achieve a high frequency modulation in an order of GHz. The modulation given from the EOM 56 in this embodiment is specifically assumed in the form of a sinusoidal wave with an angular frequency of ω.

The interference fringes obtained from the interference optical system 5 are received at the photoreceptive device 7. The received signal S at the photoreceptive device 7 has been modulated with the optical path length difference through the AOMs 54, 55 and EOM 56 and is represented by:

$$S = A + B\cos\{\omega_c t + (K/\lambda)\cos\omega t + \phi\} \quad (1)$$

where A and B are the constants determined with the intensity of the output light from the semiconductor laser 1; λ is a wavelength of the output light from the semiconductor laser 1 subjected to control; φ is the initial phase of interference; and K is a phase magnitude corresponding to the optical path length variation given from the EOM 56. From the above equation, with the exception of the bias component A, the received signal S is shown as a signal that is frequency-modulated with a carrier having an angular frequency of ωc.

In this embodiment, from the received signal S by the photoreceptive device 7, the phase amplitude, K/λ, that is a function of the wavelength in the equation (1), is detected, on the basis of which a driving condition for the semiconductor laser 1 is feedback controlled. For the purpose of this control, a demodulator that consists of a phase detector 8 and an amplitude extractor 9, and a controller 10 that feedback controls the semiconductor laser 1 based on the demodulated output from the demodulator, are provided. The phase detector 8 is a well known FM demodulator and detects the phase term, (K/λ)cosωt+φ, from the received signal S. The amplitude extractor 9 extracts the amplitude of the phase term, K/λ, from the detected phase term.

The phase amplitude K/λ detected by the amplitude extractor 9 is given to the controller 10. The controller 10 feedback controls the driver 2 so that the input phase amplitude K/λ matches to a predetermined setting that is also given to the controller 10 from the external. Specifically, the controller 10 controls the injection current to the semiconductor laser 1. On arrangement of a proportional term effective for response and an integral term for steadily allowing deviation to converge upon zero, the controller 10 can perform the injection current control with an excellent response to wavelength variations and a high control precision. When K/λ0 is given as the setting, through a control for the deviation between the amplitude K/λ obtained from the amplitude extractor 9 and the setting K/λ0 to converge upon zero, the controller 10 can stabilize the output light wavelength λ of the semiconductor laser 1 in a state of λ=λ0.

As obvious from the embodiment described above, by removing a part of the output light from the semiconductor laser 1 as the control light and introducing it into the interference optical system 5 and to modulate the interference fringes; demodulating the received signal from the interference optical system 5; and feedback controlling the injection current to the semiconductor laser 1 so that the demodulated output matches to the setting from the external, the wavelength of the output light from the semiconductor laser 1 can be stabilized. This embodiment employs a method of detecting the vibratory components of the angular frequencies ωc and ω caused by the AOM and EOM. Therefore, it can not be affected from the amplitude of the received signal, B, and the initial phase of interference, φ. Accordingly, it can perform the wavelength stabilization control without affection from fluctuations of temperature and air. Particularly, in the system that employs the semiconductor laser 1, the light intensity variation occurs when injection current varies, though the system can still stabilize the wavelength at a high precision without affection from the intensity variation.

Second Embodiment

Figure 2:
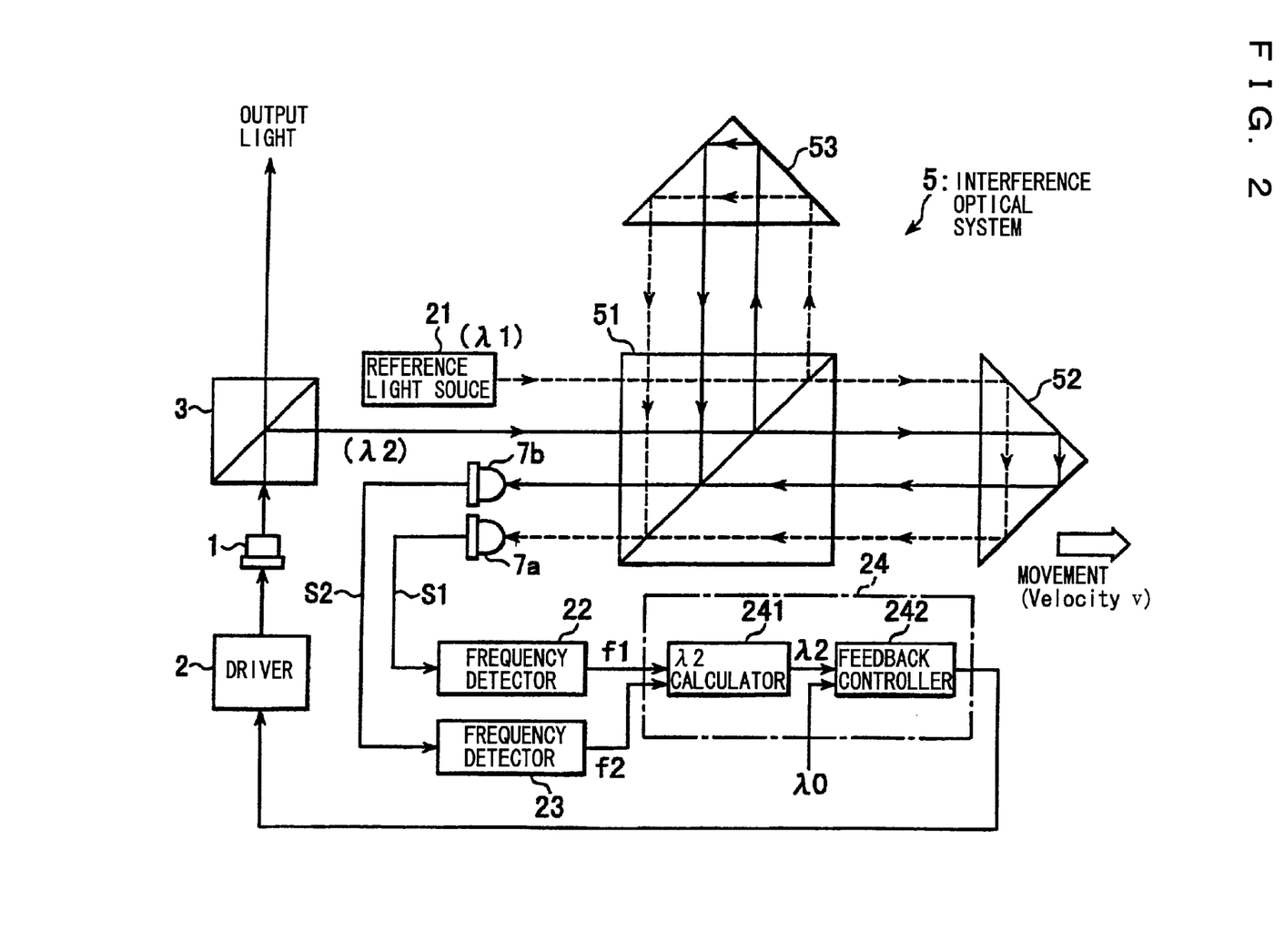
FIG. 2 is a diagram showing an arrangement of a wavelength-stabilized light source apparatus according to a second embodiment of the present invention.

FIG. 2 shows another embodiment for controlling the wavelength of the output light from the semiconductor laser 1 using a reference light source 21.

The interference optical system 5 comprises a beam splitter 51 and two mirrors 52 and 53. A reference light with a known wavelength of λ1 is introduced from the reference light source 21 via an optical path into the optical system 5, to which a control light also enters via another optical path. The control light is a part of the output light (wavelength λ2) from the variable wavelength semiconductor laser 1 and is split by the beam splitter 3. The reference light source 21 comprises a semiconductor laser 1 with a known oscillation wavelength, a He-Ne laser with a stabilized oscillation wavelength, and the like. Both interference fringes obtained in the optical system 5 with respect to the reference and the control lights are received at photoreceptive devices 7a and 7b, respectively. When the mirror 52 is displaced at a traveling velocity of v, the optical path length difference is modulated. As a result, received signals obtained from the photoreceptive devices 7a and 7b become amplitude-modulated sinusoidal wave signals that vary their intensities at a predetermined frequency.

In the interference optical system 5 of FIG. 2, the optical path length variation when the mirror 52 is displaced is double the displacement of the mirror 52. Accordingly, frequencies of the intensity variations, f1 and f2, of the received signals obtained with respect to the reference and control lights are respectively presented by f1=2v/λ1 and f2=2v/λ2 using respective wavelengths λ1 and λ2. These frequencies f1 and f2 are detected by frequency detectors 22 and 23 and fed to a controller 24. The controller 24, to which a predetermined setting is given from the external, feedback controls the driver 2 for the semiconductor laser 1 so that a frequency ratio of f1 to f2 maintains constant. The controller 24 comprises a wavelength calculator 241 for computing the wavelength λ2 of the semiconductor laser 1 based on the frequency ratio, f1/f2=λ2/λ1, between the two input frequencies f1 and f2. The controller 24 also comprises a feedback controller 242 for controlling the injection current to the semiconductor laser 1 so as to eliminate a difference between the wavelength λ2 obtained at the wavelength calculator 241 and the setting wavelength λ0 designated from the external.

As obvious from the embodiment described above, by modulating the optical path lengths for the reference and control lights simultaneously through scanning of the movable mirror 52; and through the use of the difference between the degrees of the modulations of the received signals due to different wavelengths, feedback controlling to maintain a constant ratio of the degree of the frequency modulation with the reference light to that with the control light, the wavelength stabilization for the semiconductor laser 1 can be achieved.

In the method of the second embodiment, however, scanning the movable mirror 52 at a constant velocity in one direction requires a large displacement of distance. A driving method of displacing the mirror reciprocally within a certain range is also considered. In this method, however, pulse vibrations are imparted on the mirror by inertia when the mirror is turned. To eliminate the affection from the pulse vibration requires scanning the mirror at a lower velocity. This invites a reduction of the control ability.

Third Embodiment

Figure 3:
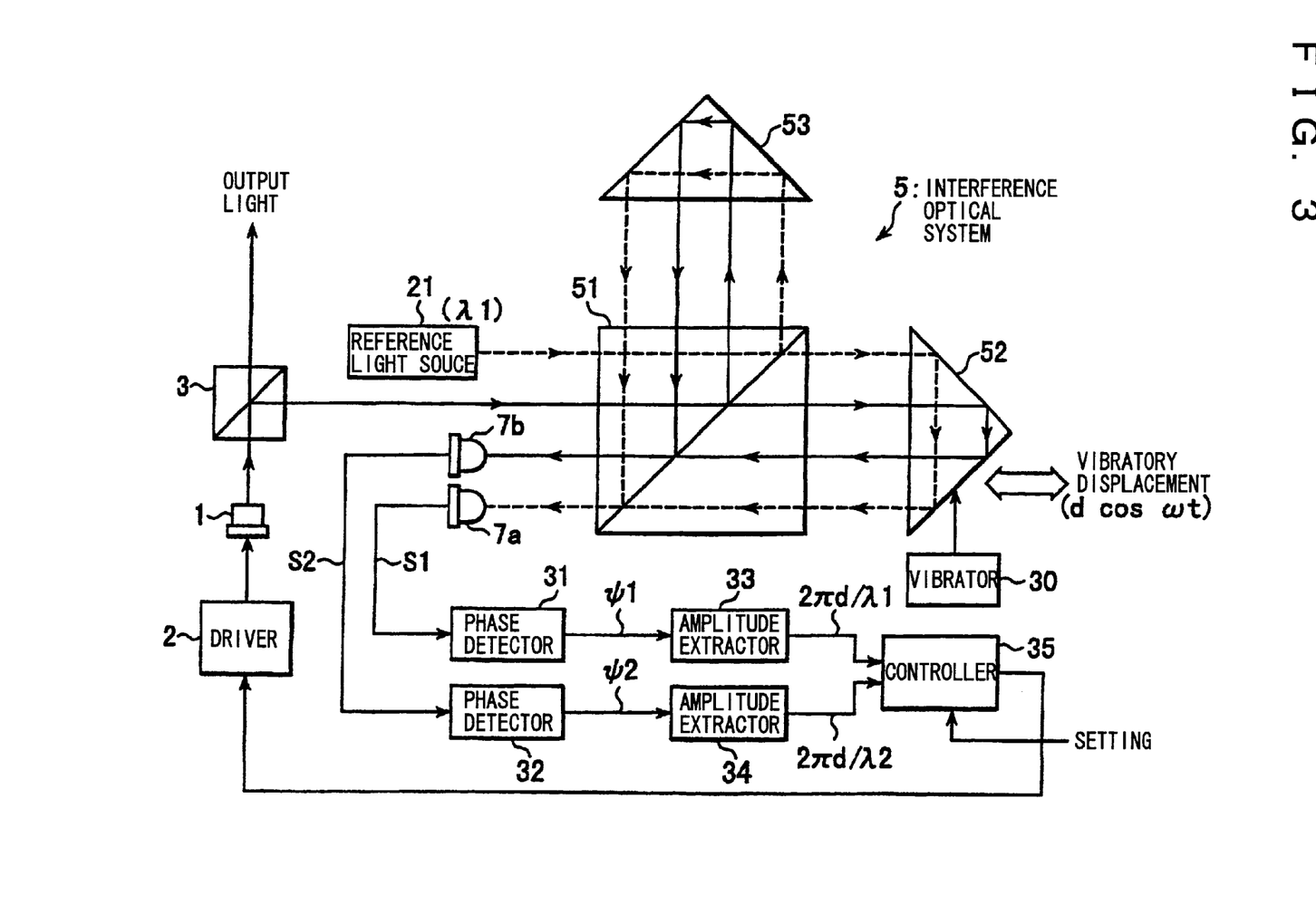
FIG. 3 is a diagram showing an arrangement of a wavelength-stabilized light source apparatus according to a third embodiment of the present invention.

FIG. 3 shows an apparatus arrangement according to a third embodiment as an improvement for the second embodiment. The optical system has the same arrangement as that in FIG. 2 essentially. In this embodiment a vibrator 30 imparts micro-vibratory displacements on the movable mirror 52. A piezoelectric device is specifically employed for the vibrator 30 to vibrate the mirror 52 with an amplitude of d at an angular frequency of $\omega$.

When photoreceptive devices 7a and 7b receive the reference (wavelength $\lambda 1$) and control (wavelength $\lambda 2$) lights respectively, they output signals S1 and S2, which are phase-modulated in sinusoidal waves accordance to respective wavelengths, as represented by the following equations (2):

$$S1 = A1 + B1\cos\{(2\pi d/\lambda 1)\cos\omega t + \phi 1\}$$

$$S2 = A2 + B2\cos\{(2\pi d/\lambda 2)\cos\omega t + \phi 2\} \quad (2)$$

where A1, A2 denote DC components; B1, B2 light intensity amplitudes; and $\phi 1$, $\phi 2$ initial phase magnitudes.

When known phase detectors 31 and 32 demodulate thus obtained received signals S1 and S2, they output phase signals $\Psi 1$ and $\Psi 2$ respectively represented by the following equation (3):

$$\psi 1 = (2\pi d/\lambda 1)\cos\omega t + \phi 1$$

$$\psi 2 = (2\pi d/\lambda 2)\cos\omega t + \phi 2 \quad (3)$$

Amplitude extractors 33 and 34 extract amplitudes, $p1 = 2\pi d/\lambda 1$ and $p2 = 2\pi d/\lambda 2$, from these phase signals $\psi 1$ and $\psi 2$ and feed them to a controller 35. The controller 35 feedback controls the driver 2 for the semiconductor laser 1 so that a ratio, $p1/p2 = \lambda 2/\lambda 1$, of the amplitudes mentioned above maintains constant based on the setting from the external. Similar to the second embodiment, the controller 35 comprises the wavelength calculator for computing the wavelength $\lambda 2$ of the semiconductor laser 1 based on the ratio between the two amplitudes mentioned above. It also comprises the feedback controller for controlling the injection current to the semiconductor laser 1 so that the obtained wavelength $\lambda 2$ matches to the wavelength $\lambda 0$ designated from the external. This specific configuration can achieve the stabilization control for the wavelength of the output light emitted from the semiconductor laser 1.

According to this embodiment, with the use of the sinusoidal wave phase modulation method that imparts micro-vibrations on the movable mirror 52 in the interference optical system 5, by phase-modulating the reference and control lights and feedback controlling a ratio between their demodulated outputs to match to a predetermined level, the wavelength can be stabilized. The micro-vibration can be easily imparted on the mirror 52 using a piezoelectric device and the like. Thus, a practical wavelength control can be achieved.

Fourth Embodiment

Figure 4:
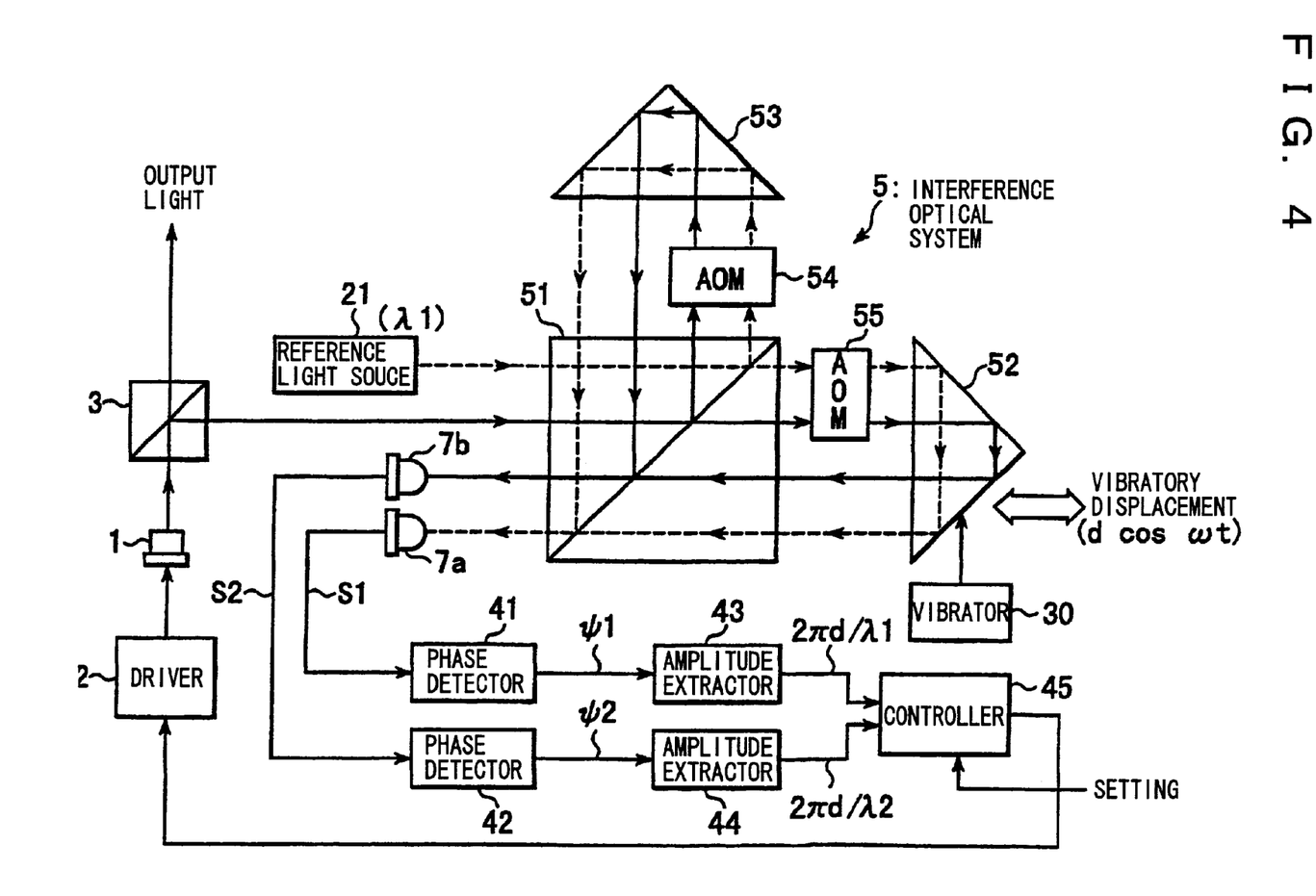
FIG. 4 is a diagram showing an arrangement of a wavelength-stabilized light source apparatus according to a fourth embodiment of the present invention.

FIG. 4 shows a fourth embodiment that employs an additional frequency modulation method in combination with the sinusoidal wave phase modulation method of the third embodiment.

In the fourth embodiment, the AOMs 54 and 55 are interposed at some midpoints in the optical paths as modulators for modulating the optical path length difference, similar to the first embodiment. As shown in FIG. 4, the first AOM 54 is located on the forward path between the beam splitter 51 and the mirror 53 and the second AOM 55 on the forward path between the beam splitter 51 and the mirror 52.

When the AOMs 54 and 55 are driven under such the arrangement, unlike the system that employs the mechanical signal, regardless to the wavelengths of the reference and control lights, an interfered beat signal can be generated in an order of 0.1–10 MHz. For example, the first AOM 54 is driven with an angular frequency of $\omega c1$ and the second AOM 55 with an angular frequency of $\omega c2$. As a result, an interfered beat signal with $\omega c = \omega c1 - \omega c2$, which corresponds to the difference between the angular frequencies $\omega c1$ and $\omega c2$, is superimposed both on the signals S1 and S2 received at the photoreceptive devices 7a and 7b, as represented by the following equations (4):

$$S1 = A1 + B1\cos\{\omega ct + (2\pi d/\lambda 1)\cos\omega t + \phi 1\}$$

$$S2 = A2 + B2\cos\{\omega ct + (2\pi d/\lambda 2)\cos\omega t + \phi 2\} \quad (4)$$

As obvious from the equation (4), the signals S1 and S2 are frequency-modulated with a carrier frequency of $\omega c$, with the exception of the bias component A1 and A2. Phase detectors 41 and 42 demodulate the received signals S1 and S2, respectively. Thus, similar to those represented by the equation (3) shown in the third embodiment, phase signals $\Psi 1$ and $\Psi 2$ are obtained from the respective received signals S1 and S2. Phase extractors 23 and 24 extract amplitudes, $p1 = 2\pi d/\lambda 1$ and $p2 = 2\pi d/\lambda 2$, from these phase signals $\psi 1$ and $\psi 2$ in the same manner as in the third embodiment. Then, a controller 45 feedback controls the driver 2 for the semiconductor laser 1 so that the amplitude ratio of $p1/p2 (= \lambda 2/\lambda 1)$ becomes constant based on the setting from the external. The controller 45 has the same configuration as those in the second and third embodiments for controlling the injection current to the semiconductor laser 1. Thus, the wavelength stabilizing control for the semiconductor laser 1 can be achieved.

According to this embodiment, the angular frequency $\omega c$ of the interfered beat signal caused by the AOM can be designed sufficiently higher than the angular frequency $\omega$ with the mechanical vibration. As a result, through FM demodulation, the above phase term can be detected at a high precision and speed. The use of the phase and frequency modulations in combination can prevent variations of the initial phases $\phi 1$, $\phi 2$ and light intensity amplitudes B1, B2 from effecting of the system. In other words, it can perform the wavelength stabilization control without affection from fluctuations of temperature and air. Particularly, in the system that employs the semiconductor laser, the light intensity variation occurs when the oscillation wavelength varies, though the system can still stabilize the wavelength at a high precision without affection from such the intensity variation.

Fifth Embodiment

Figure 5:
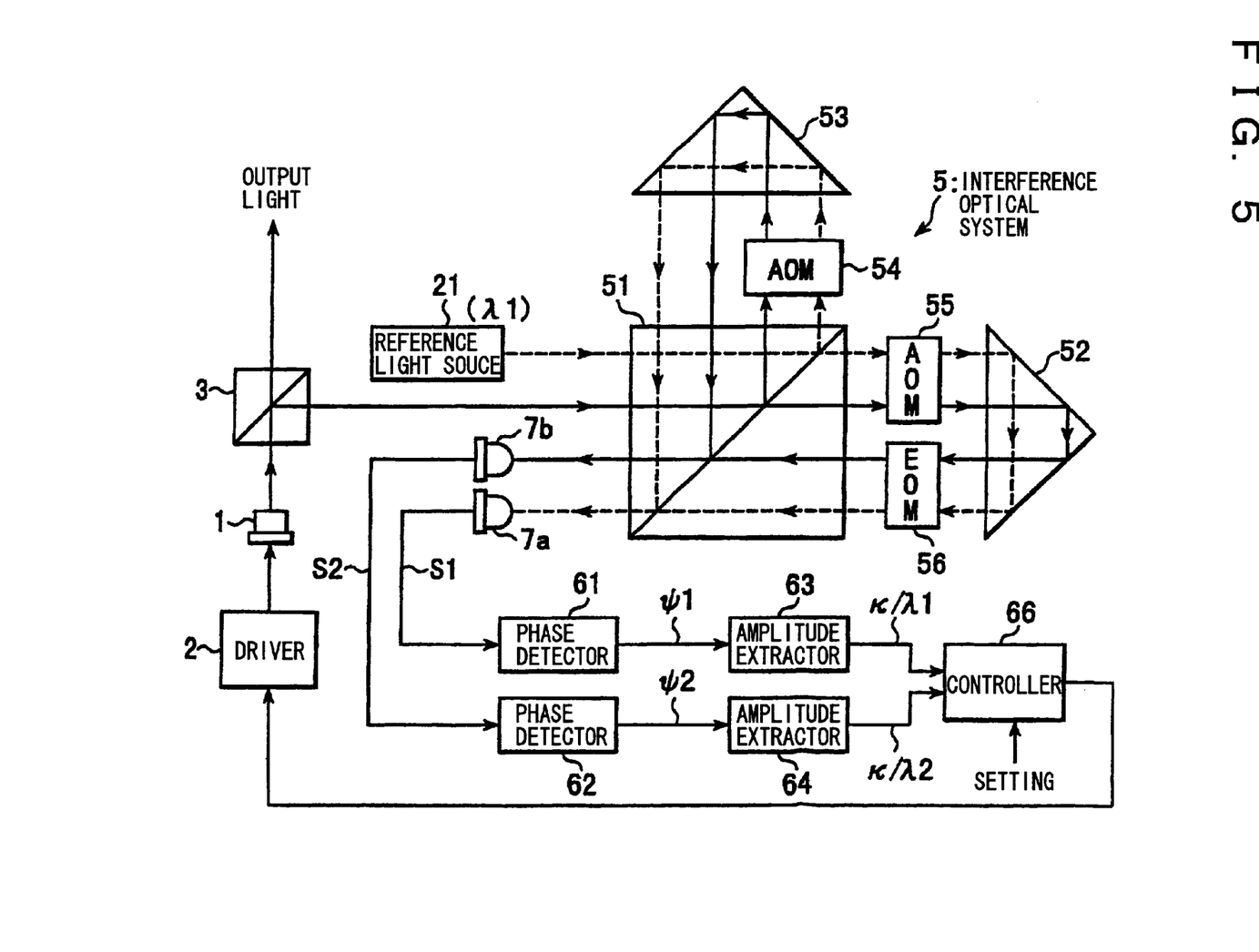
FIG. 5 is a diagram showing an arrangement of a wavelength-stabilized light source apparatus according to a fifth embodiment of the present invention.

FIG. 5 shows a fifth embodiment, which is based on the fourth embodiment but electrically modulates the optical path length difference, instead of the modulation of the optical path length difference by vibrating the mirror 52 mechanically.

For this purpose, an electric optical modulator (EOM) 56 is interposed in the return path between the beam splitter 51 and the mirror 52. A driving signal in the form of sinusoidal wave is supplied to the EOM 56. The EOM 56 exhibits a refractive index variation in response to an electric field application. Thus, driving the EOM 56 with the sinusoidal wave signal is similar to give a sinusoidal wave variation to the optical path length difference in the interference optical system 5. The AOMs 54 and 55 are driven in the same manner as in the fourth embodiment.

As a result, the signals S1 and S2 received at the photoreceptive devices 7a and 7b are frequency-modulated as represented by the following equations (5):

$$S1 = A1 + B1\cos\{\omega ct + (k/\lambda 1)\cos\omega t + \phi 1\}$$
$$S2 = A2 + B2\cos\{\omega ct + (k/\lambda 2)\cos\omega t + \phi 2\} \quad (5)$$

where k denotes an apparent variation of the optical path length obtained from driving by the EOM 56.

Phase detectors 61 and 62 FM-demodulate the received signals S1 and S2 in the same manner as in the fourth embodiment. Thus, phase signals, $\Psi 1 = (k/\lambda 1)\cos\omega t + \phi 1$ and $\Psi 2 = (k/\lambda 2)\cos\omega t + \phi 2$, are obtained. Amplitudes, $p1 = k/\lambda 1$ and $p2 = k/\lambda 2$, extracted from these phase signals $\Psi 1$ and $\Psi 2$ are given to a controller 66. The controller 66 feedback controls the driver 2 so that the amplitude ratio of p1/p2 (=$\lambda 2/\lambda 1$) becomes constant based on the setting from the external. The controller 66 has the same configuration as those in the second through fourth embodiments for controlling the injection current to the semiconductor laser 1. Thus, the wavelength stabilizing control for the semiconductor laser 1 can be achieved.

The method of imparting mechanical vibrations on the mirror has the upper limit of the modulation frequency due to the inherent vibration of the mechanism, which is limited to an order of kHz. To the contrary, the method that employs the EOM 56 like this embodiment can achieve the similar phase modulation at an extremely higher frequency, for example, up to GHz order. Accordingly, this embodiment can perform a much faster and more stable wavelength control. In addition, due to the fastness of the EOM, driving with a triangular wave signal can achieve the same action as giving an addition or reduction of a certain velocity on the optical path length within a certain period.

In the embodiments, although the semiconductor laser is exemplified as the coherent light source that is subjected to wavelength stabilization, the present invention is not limited to this example, rather adaptive to a gas laser and the like similarly.

Having described the embodiments consistent with the invention, other embodiments and variations consistent with the invention will be apparent to those skilled in the art. Therefore, the present invention should not be viewed as limited to the disclosed embodiments but rather should be viewed as limited only by the spirit and scope of the appended claims.

What is claimed is:

1. A wavelength-stabilized light source apparatus, comprising:
    a coherent light source of which wavelength is variably controlled by a driver;
    a beam splitter for splitting the output light from said coherent light source to obtain a part thereof as a control light;
    a interference optical system for further splitting said control light in two, then giving a predetermined optical path length difference to the resultant two control lights and synthesizing them to generate interference fringes;
    a modulator means for giving a variation to said optical path length difference in said interference optical system to modulate said interference fringes to be obtained;
    a photoreceptive device for receiving said interference fringes obtained from said interference optical system;
    a demodulator for detecting a degree of modulation of a received signal obtained from said photoreceptive device; and
    a controller for feedback controlling a driving condition for said driver so that the output from said demodulator matches to a predetermined setting.

2. The wavelength-stabilized light source apparatus of claim 1, said modulator including:
    two acoustic optical modulators arranged on respective optical paths of said two control lights in said interference optical system and driven with different angular frequencies from each other to generate an interfered beat signal with a difference between said angular frequencies, $\omega c$; and
    an electrical optical modulator arranged on one of said optical paths of said two control lights in said interference optical system for phase-modulating said output light in the form of a sinusoidal wave with an angular frequency of $\omega$, said demodulator including:
    a phase detector for FM-demodulating said received signal using a carrier signal with an angular frequency of $\omega c$ to obtain the phase term of said received signal; and
    an amplitude extractor for extracting an amplitude of said phase term detected by said phase detector, wherein
        said controller feedback controls a driving condition for said coherent light source so that said amplitude of said phase term extracted by said amplitude extractor matches to a predetermined setting.

3. The wavelength-stabilized light source apparatus of claim 1, wherein said coherent light source comprises a semiconductor laser having a wavelength variably controllable with an injection current supplied from said driver.

4. A wavelength-stabilized light source apparatus, comprising:
    a reference light source for emitting a coherent reference light with a constant wavelength;
    a coherent light source of which wavelength is variably controlled by a driver;
    a beam splitter for splitting the output light from said coherent light source to obtain a part thereof as a control light;
    a interference optical system for receiving said control light split by said beam splitter and said reference light from said reference light source via different optical paths, splitting said control and reference lights respectively in two, then giving a predetermined optical path length difference respectively to the resultant two control and reference lights and synthesizing them to generate two interference fringes;

a modulator means for giving the same variation respectively to said optical path length differences of said reference and control lights in said interference optical system to modulate said two interference fringes obtained with respect to said reference and control lights;

a pair of photoreceptive devices for receiving said two interference fringes with respect to said reference and control lights from said interference optical system;

a pair of demodulators for detecting degrees of modulations of received signals obtained with respect to said reference and control lights from said pair of photoreceptive devices; and a controller for feedback controlling a driving condition for said driver so that a ratio between the outputs from said pair of demodulators matches to a predetermined setting.

5. The wavelength-stabilized light source apparatus of claim 4, wherein said modulator imparts an additional or reductive displacement at a constant velocity both on said optical path length differences of said reference and control lights to amplitude-modulate said two interference fringes obtained with respect to said reference and control lights in accordance with wavelengths thereof respectively; said pair of demodulators comprising a pair of frequency detectors for detecting frequencies, f1 and f2, of intensity variations of said amplitude-modulated received signals obtained with respect to said reference and control lights, and wherein said controller feedback controls said driver so that a ratio between said frequencies f1 and f2 detected by said frequency detectors matches to a predetermined setting.

6. The wavelength-stabilized light source apparatus of claim 5, said controller including:

a wavelength calculator for computing said wavelength of said coherent light source on the basis of a ratio between two input frequencies f1 and f2; and a feedback controller for feedback controlling said driver so that a difference between said wavelength obtained by said wavelength calculator and a wavelength designated from the external matches to zero.

7. The wavelength-stabilized light source apparatus of claim 4, wherein said modulator imparts a vibration in the form of a sinusoidal wave with a predetermined amplitude of d and an angular frequency both on said optical path length differences of said reference and control lights to phase-modulate said received lights obtained with respect to said reference and control lights in accordance with wavelengths thereof respectively, said pair of demodulators including:

a pair of phase detectors for PM-demodulating said phase-modulated received signals obtained with respect to said reference and control lights to detect the phase terms, $\psi 1=(2\pi d/\lambda 1)+\phi 1$ and $\psi 2=(2\pi d/\lambda 2)+\phi 2$ (where $\lambda 1$, $\lambda 2$ denote wavelengths of said reference and control lights, and $\phi 1$, $\phi 2$ initial phase magnitudes); and a pair of amplitude extractors for extracting amplitudes of said phase terms, $2\pi d/\lambda 1$ and $2\pi d/\lambda 2$, obtained by said phase detectors, and wherein said controller feedback controls said driver so that a ratio, $\lambda 2/\lambda 1$, between said amplitudes extracted by said amplitude extractors matches to a predetermined setting.

8. The wavelength-stabilized light source apparatus of claim 7, said controller including:

a wavelength calculator for computing said wavelength of said coherent light source on the basis of a ratio between two input amplitudes; and a feedback controller for feedback controlling said driver so that a difference between said wavelength obtained by said wavelength calculator and a wavelength designated from the external matches to zero.

9. The wavelength-stabilized light source apparatus to claim 4, said modulator including:

a phase modulator for imparting a vibration in the form of a sinusoidal wave with a predetermined amplitude of d and an angular frequency of $\omega$ both on said optical path length differences of said reference and control lights; and acoustic optical modulators for frequency-modulating said received signals obtained with respect to said reference and control lights in accordance with wavelengths thereof by superimposing an interfered best signal with an angular frequency of $\omega c$ both on said received signals of said reference and control lights; said pair of demodulators including:

a pair of phase detectors for FM-demodulating said frequency modulated received signals obtained with respect to said reference and control lights using a carrier angular frequency of $\omega c$ to detect the phase terms, $\psi 1=(2\pi d/\lambda 1)\cos\omega t\phi 1$ and $\psi 2=(2\pi d/\lambda 2)\cos\omega t+\phi 2$ (where $\lambda 1$, $\lambda 2$ denote wavelengths of said reference and control lights, and $\phi 1$, $\phi 2$ initial phase magnitudes); and a pair of amplitude extractors for extracting amplitudes of said phase terms, $2\pi d/\lambda 1$ and $2\pi d/\lambda 2$, obtained by said phase detectors, and wherein said controller feedback controls said driver so that a ratio $\lambda 2/\lambda 1$, between said amplitudes obtained by said amplitude extractors matches to a predetermined setting.

10. The wavelength-stabilized light source apparatus of claim 9, said controller including:

a wavelength calculator for computing said wavelength of said coherent light source on the basis of said ratio between two inputs; and a feedback controller for feedback controlling said driver so that a difference between said wavelength obtained by said wavelength calculator and a wavelength designated from the external matches to zero.

11. The wavelength-stabilized light source apparatus of claim 9, said phase modulator comprises an electric optical modulator.

* * * * *